United States Patent
Nomura et al.

(10) Patent No.: US 9,360,776 B2
(45) Date of Patent: Jun. 7, 2016

(54) ALIGNMENT CORRECTION METHOD FOR SUBSTRATE TO BE EXPOSED, AND EXPOSURE APPARATUS

(71) Applicant: V TECHNOLOGY CO., LTD., Yokohama-shi (JP)

(72) Inventors: Yoshiaki Nomura, Yokohama (JP); Toshinari Arai, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 352 days.

(21) Appl. No.: 14/168,212

(22) Filed: Jan. 30, 2014

(65) Prior Publication Data

US 2014/0146299 A1 May 29, 2014

Related U.S. Application Data

(63) Continuation of application No. PCT/JP2012/069339, filed on Jul. 30, 2012.

(30) Foreign Application Priority Data

Aug. 3, 2011 (JP) .................. 2011-170292

(51) Int. Cl.
| | | |
|---|---|---|
| *G01B 11/00* | (2006.01) | |
| *G03B 27/32* | (2006.01) | |
| *G03B 27/74* | (2006.01) | |
| *G03F 9/00* | (2006.01) | |
| *H01L 21/68* | (2006.01) | |
| *G03F 7/20* | (2006.01) | |

(52) U.S. Cl.
CPC .............. *G03F 9/7015* (2013.01); *G03F 9/00* (2013.01); *G03F 9/7019* (2013.01); *H01L 21/682* (2013.01); *G03F 7/70791* (2013.01)

(58) Field of Classification Search
CPC ... G03F 7/70275; G03F 7/70791; G03F 9/00; G03F 9/7015; G03F 9/7019
USPC ............. 310/12.05, 12.06, 12.19; 355/68, 72, 355/77; 356/399–401, 616
See application file for complete search history.

(56) References Cited

U.S. PATENT DOCUMENTS

2009/0059297 A1* 3/2009 Uemura ................ G03F 9/7003
358/1.18

FOREIGN PATENT DOCUMENTS

| JP | 2003-162068 A | 6/2003 |
|---|---|---|
| JP | 2006-337874 A | 12/2006 |
| JP | 2008-076709 A | 4/2008 |
| JP | 2009-230008 A | 10/2009 |
| JP | 2010-054849 A | 3/2010 |
| JP | 2010-231062 A | 10/2010 |

* cited by examiner

*Primary Examiner* — Colin Kreutzer
(74) *Attorney, Agent, or Firm* — McDermott, Will & Emery LLP (57) ABSTRACT

An alignment correction method includes: the step of detecting coordinates of a first observation point 14 and a second observation point 15 set in advance on a substrate to be exposed 1 that is being scanned in a scanning direction A, in order to observe an alignment deviation of the substrate to be exposed 1; the step of computing a correction amount based on a deviation between the detected coordinates and a reference line set in advance according to the first observation point 14 and the second observation point 15; and the step of correcting alignment of a subsequent substrate to be exposed 1 based on the computed correction amount.

6 Claims, 11 Drawing Sheets

ALIGNMENT CORRECTION METHOD FOR SUBSTRATE TO BE EXPOSED, AND EXPOSURE APPARATUS

CROSS-REFERENCE TO RELATED APPLICATION

This application is a continuation application of PCT/JP2012/069339, filed on Jul. 30, 2012.

BACKGROUND OF THE INVENTION

1. Field of the Invention

The present invention relates to an alignment correction method for a substrate to be exposed, and to an exposure apparatus, which correct an alignment deviation occurring at a substrate to be exposed that has been aligned to a photomask, and more specifically, relates to an alignment correction method for a substrate to be exposed, and to an exposure apparatus, which correct alignment of a subsequent substrate to be exposed based on a correction amount computed from an alignment deviation of a previously exposed substrate to be exposed, to thereby enhance alignment accuracy.

2. Description of Related Art

A conventional alignment correction method for a substrate to be exposed is such that by using an image-capturing device having a plurality of light-receiving elements linearly arranged in a direction perpendicular to a scanning direction of the substrate to be exposed, an image of a plurality of rectangular pixels formed on the substrate to be exposed is captured; a position of a left side edge of a left-most pixel of the substrate to be exposed is detected based on brightness information of the captured image; a position deviation amount between the position of the left side edge of the leftmost pixel and a reference position set in advance in the image capturing device is computed; and a photomask is moved in a direction perpendicular to the scanning direction of the substrate to be exposed so as to correct the position deviation amount, to thereby align the photomask to the substrate to be exposed (for example, refer to Japanese Laid-Open (Kokai) Patent Application Publication No. 2008-76709).

However, in the above conventional alignment correction method for a substrate to be exposed, since correction of alignment of the substrate to be exposed is performed each time the substrate to be exposed arrives and its alignment deviation is detected, if the position of a camera for alignment mark detection is shifted due to, for example, deformation of an exposure apparatus caused by heat and alignment accuracy of the substrate to be exposed is deteriorated before exposure, there is not enough time to correct the alignment, and defective exposure may occur.

SUMMARY OF THE INVENTION

Therefore, in order to address such a problem, it is an object of the present invention to provide an alignment correction method of a substrate to be exposed, and an exposure apparatus, which can enhance alignment accuracy of a substrate to be exposed when alignment accuracy of the substrate to be exposed, that has not been subjected to exposure, is deteriorated.

In order to solve the above problems, the alignment correction method according to an aspect of the present invention corrects alignment of a subsequent substrate to be exposed based on an alignment deviation of a previously exposed substrate to be exposed, in a process of exposing successively substrates to be exposed that are being scanned in a scanning direction by a scanning device. The method includes the following steps: detecting coordinates of a first observation point and a second observation point set in advance on a substrate to be exposed, in order to observe an alignment deviation of the substrate to be exposed that is being scanned in the scanning direction; computing a correction amount based on a deviation between the detected coordinates and a reference line set in advance according to the first observation point and the second observation point; and correcting alignment of a subsequent substrate to be exposed based on the computed correction amount.

Furthermore, the alignment of the substrates to be exposed is performed based on information of a first alignment mark and a second alignment mark formed on a surface of the substrate to be exposed, that are detected by a first camera provided on an upstream side of the scanning direction and a second camera provided on a downstream side in the scanning direction. In the correction amount computing step, offset amounts and a gain amount are computed, and the offset amounts are correction amounts of the first alignment mark provided on the upstream side of the scanning direction of the substrate to be exposed and a second alignment mark provided on the downstream side in the scanning direction, in a direction intersecting the scanning direction in a plane parallel to a scanning plane, and the gain amount is a correction amount of tilt of the substrate to be exposed with respect to the reference line. In the alignment correction step, after detecting the first alignment mark and the second alignment mark by the first camera and the second camera and aligning the substrate to be exposed, the substrate to be exposed is rotated by the gain amount about the center of the first and second alignment marks so that these marks are symmetrical about the center, and these marks are moved by the offset amount in a direction intersecting the scanning direction, to thereby correct the alignment of the substrate to be exposed.

Furthermore, the alignment of the substrates to be exposed is performed based on information of a first alignment mark and a second alignment mark formed on a surface of the substrate to be exposed, that are detected by a first camera provided on the upstream side of the scanning direction and a second camera provided on the downstream side in the scanning direction. In the correction amount computing step, a first camera correction amount and a second camera correction amount are computed based on a deviation between the coordinates of the first and second observation points and the reference line. The first camera correction amount is a correction amount of the first camera, and the second camera correction amount is a correction amount of the second camera, in a direction intersecting the scanning direction in a plane parallel to the scanning plane. In the alignment correction step, the first camera is moved by a first camera correction amount, and the second camera is moved by a second camera correction amount, in a direction intersecting the scanning direction, to thereby correct the alignment of the substrate to be exposed.

Furthermore, the alignment of the substrates to be exposed is performed based on information of a first alignment mark and a second alignment mark formed on a surface of the substrate to be exposed, that are detected by a first camera provided on the upstream side of the scanning direction and a second camera provided on the downstream side in the scanning direction. In the correction amount computing step, a first axis correction amount and a second correction amount are computed based on a deviation between the coordinates of the first and second observation points and the reference line. The first axis correction amount is a correction amount of a first axis, and the second correction amount is a correction amount of a second axis, in a direction intersecting the scanning direction in a plane parallel to the scanning plane. In the alignment correction step, after detecting the first alignment mark and the second alignment mark by the first camera and the second camera and aligning the substrate to be exposed, the first axis is moved by the first axis correction amount and the second axis is moved by the second axis correction amount, in a direction intersecting the scanning direction, to thereby correct the alignment of the substrate to be exposed.

Furthermore, in the correction amount computing step, the computed correction amount for each of substrates to be exposed having different shapes is stored in a storing device, and in the alignment correction step, alignment of the substrate to be exposed is corrected by using the stored correction amounts for the substrates to be exposed having different shapes.

Furthermore, an exposure apparatus according to an aspect of the present invention which corrects an alignment deviation of a subsequent substrate to be exposed based on an alignment deviation of a previously exposed substrate to be exposed, and exposes successively substrates to be exposed that are being scanned in a scanning direction by a scanning device. The apparatus includes: a coordinate detection device that detects coordinates of a first observation point and a second observation point set in advance on a substrate to be exposed that is being scanned in the scanning direction, in order to observe an alignment deviation of the substrate to be exposed; a correction amount computing device that computes a correction amount based on a deviation between the detected coordinates and a reference line set in advance according to the first observation point and the second observation point; and an alignment correction device that corrects alignment of a subsequent substrate to be exposed based on the computed correction amount.

According to a first aspect of the present invention, at a time of exposing successively substrates to be exposed, a correction amount is computed based on an alignment deviation of a previously exposed substrate to be exposed, and an alignment deviation of a subsequent substrate to be exposed is corrected, and thus, it is possible to align the subsequent substrate to be exposed in a state in which the alignment deviation is corrected in advance. Accordingly, even in a case in which alignment accuracy before exposure is deteriorated, it is possible to avoid a situation that correction of the alignment cannot catch up, and to enhance alignment accuracy.

Furthermore, according to a second aspect of the present invention, after detecting the first alignment mark and the second alignment mark by the first camera and the second camera and aligning the substrate to be exposed, the substrate to be exposed is rotated by the gain amount about the center of the first and second alignment marks so that the first and second alignment marks are symmetrical about the center, and these marks are moved by the offset amount in a direction intersecting the scanning direction in a plane parallel to a scanning plane, to thereby correct the alignment of the substrate to be exposed. Accordingly, regardless of movable ranges of the first camera and the second camera or the construction of an alignment device such as the first axis and the second axis for the substrate to be exposed, it is possible to correct alignment of the substrate to be exposed.

Furthermore, according to a third aspect of the present invention, the first camera is moved by a first camera correction amount, and the second camera is moved by a second camera correction amount, in a direction intersecting the scanning direction in a plane parallel to a scanning plane, to thereby correct the alignment of the substrate to be exposed. Accordingly, even in a case in which alignment accuracy is deteriorated before exposure, it is possible to correct alignment of the substrate to be exposed so long as the deviation is within movable ranges of the first camera and the second camera.

Furthermore, according to a fourth aspect of the present invention, after detecting the first alignment mark and the second alignment mark by the first camera and the second camera and aligning the substrate to be exposed, the first axis is moved by the first axis correction amount and the second axis is moved by the second axis correction amount in a direction intersecting the scanning direction in a plane parallel to a scanning plane, to thereby correct the alignment of the substrate to be exposed. Accordingly, even in a case in which the first camera and the second camera are fixed and are not movable, it is possible to correct the alignment of the substrate to be exposed.

Furthermore, according to a fifth aspect of the present invention, based on correction amounts stored for each of the substrates to be exposed having different shapes, it is possible to correct alignment of subsequent substrates to be exposed having the same shape. Accordingly, with respect to subsequent substrates to be exposed having the same shape as that of which a correction amount is computed and stored, it is possible to perform alignment of the first substrate in a corrected state.

Furthermore, according to a sixth aspect of the present invention, at a time of exposing successively substrates to be exposed, a coordinate detection device detects an alignment deviation of a previously exposed substrate to be exposed, a correction amount computing device computes a correction amount based on the detected alignment deviation, and an alignment correction device corrects an alignment deviation of a subsequent substrate to be exposed is corrected. Accordingly, it is possible to align the subsequent substrate to be exposed in a state in which the alignment deviation is corrected in advance. Accordingly, even in a case in which alignment accuracy before exposure is deteriorated, it is possible to avoid a situation in which correction of the alignment cannot catch up, and to enhance alignment accuracy.

DESCRIPTION OF PREFERRED EMBODIMENTS

Hereinbelow, embodiments of the present invention will be explained in detail with reference to the accompanying drawings.

Figure 1:
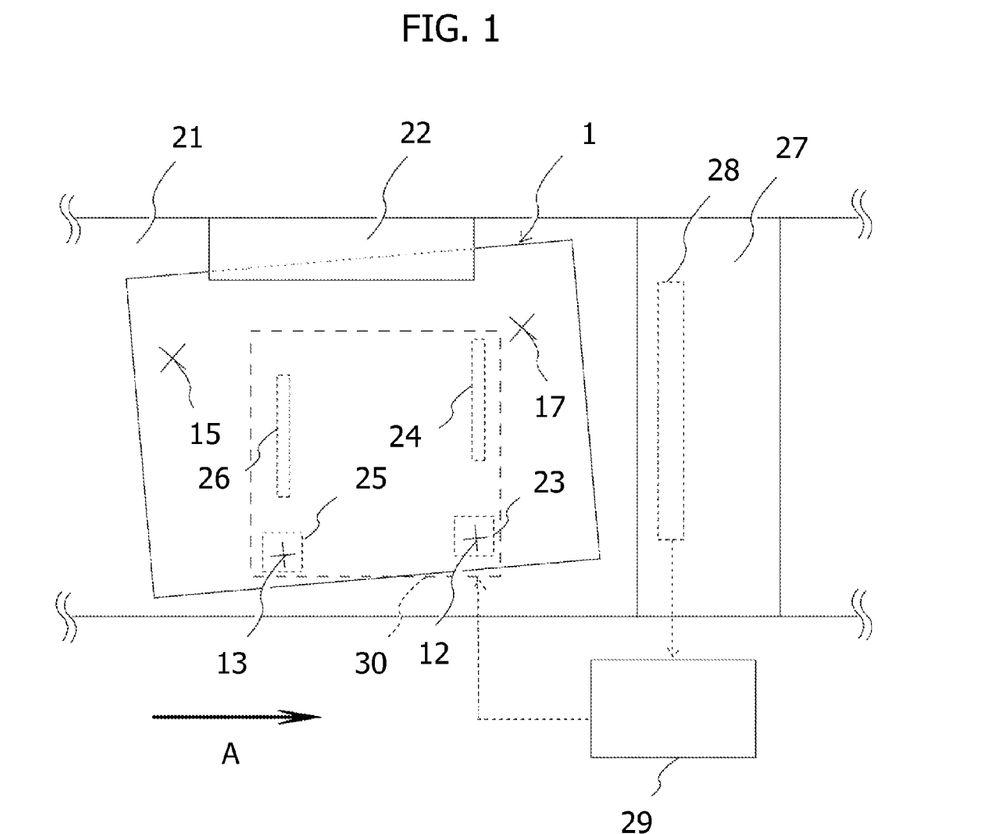
FIG. 1 is a schematic view illustrating a substrate to be exposed, which is exposed by an alignment correction method for a substrate to be exposed according to the present invention, and an exposure apparatus.
Figure 2:
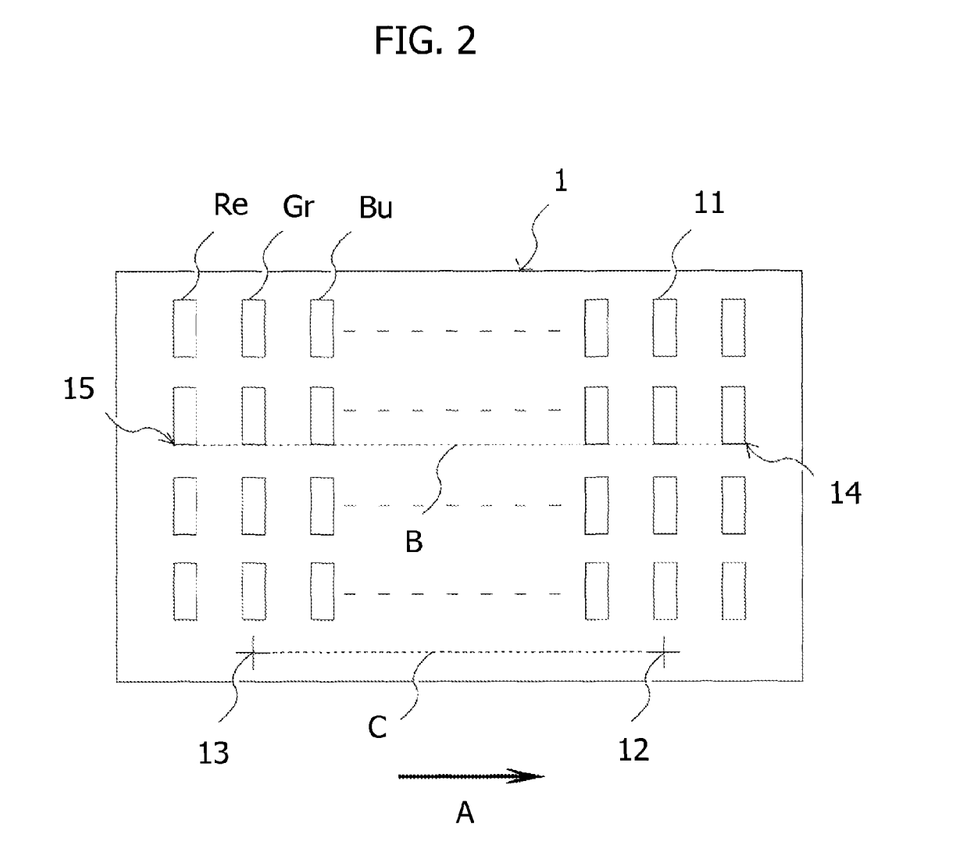
FIG. 2 is a plan view illustrating a surface structure of the substrate to be exposed.

FIG. 1 is a schematic view illustrating a substrate to be exposed 1 that is exposed by an alignment correction method for a substrate to be exposed according to the present invention (hereinafter simply referred to as "alignment correction method"), and an exposure apparatus according to the present invention. The substrate to be exposed 1 is a substrate such as a color filter to be employed in a liquid crystal display, which is scanned in a predetermined scanning direction A by a scanning device 22 of an exposure apparatus, to be described later, to be exposed by an exposure device 27. As illustrated in FIG. 2, the substrate to be exposed 1 has a surface provided with a plurality of pixels 11 of red (Re), green (Gr) and blue (Bu) colors formed in a matrix form, a first alignment mark 12 formed on an upstream side and a second alignment mark 13 formed on a downstream side in the scanning direction A.

The pixels 11 are, as illustrated in FIG. 2, each formed in a substantially rectangular shape elongated in a direction perpendicular to the scanning direction A (hereinafter simply referred to as "perpendicular direction"), and its surrounding area of the pixels 11 is coated with black matrix (BM). Then, in FIG. 2, a lower right corner of a upstream side pixel 11 in the scanning direction A is designated as a first observation point 14 for observing alignment deviation of the substrate to be exposed 1, and a lower left corner of a downstream side pixel 11 in the scanning direction A on the same row as the above pixel 11 is designated as a second observation point 15 in advance. Here, the first alignment mark 12 and the second alignment mark 13 are provided so that a straight line B connecting the first observation point 14 and the second observation point 15 is parallel to a straight line C connecting the first alignment mark 12 and the second alignment mark 13. Here, the first observation point 14 and the second observation point 15 may be determined at an optional row of the pixels 11 arranged in a matrix form.

An exposure apparatus for exposing the substrate to be exposed 1 includes, as illustrated in FIG. 1, a stage 21 on which a substrate to be exposed 1 is placed; a scanning device 22 for scanning the substrate to be exposed 1 in a predetermined scanning direction A; a first camera 23 and a first axis 24 provided on the upstream side in the scanning direction A; a second camera 25 and a second axis 26 provided on the downstream side; the exposure device 27 for exposing the substrate to be exposed 1; a line image sensor 28 provided on the downstream side of the exposure device 27 in the scanning direction A; a correction amount computing device 29; and an alignment correction device 30. The first camera 23 and the second camera 25 are cameras for detecting the first alignment mark 12 and the second alignment mark 13, respectively, to align the substrate to be exposed 1. The cameras are attached above the stage 21 so as to be movable in a direction perpendicular to the scanning direction A in a plane parallel to a plane of the stage 21. Furthermore, the first axis 24 and the second axis 26 are axes for supporting from an under side a substrate to be exposed 1 placed on the stage 21 and moving the substrate in a plane parallel to a plane of the stage 21 in order to align the substrate to be exposed 1, and they are configured to be movable in the direction perpendicular to the scanning direction A. Furthermore, the line image sensor 28 is a coordinate detection device that detects coordinates of the first observation point 14 and the second observation point 15 in order to observe alignment deviation of the subsequent substrate to be exposed 1 that is being scanned in the scanning direction A, and employs solid state image-capturing elements such as CCD or CMOS. Furthermore, the correction amount computing device 29 computes a correction amount of alignment of the substrate to be exposed 1 based on a deviation of coordinates of the first observation point 14 and the second observation point 15 detected by the line image sensor 28, from a reference line parallel to the scanning direction A set in advance according to the first observation point 14 and the second observation point 15. Furthermore, the alignment correction device 30 is constituted by a combination of the first camera 23 and the second camera 25, or a combination of the first axis 24 and the second axis 26.

Next, a first embodiment of the alignment correction method for a substrate to be exposed 1 by the exposure apparatus having such a configuration will be explained with reference to FIGS. 2 to 8.

Figure 3:
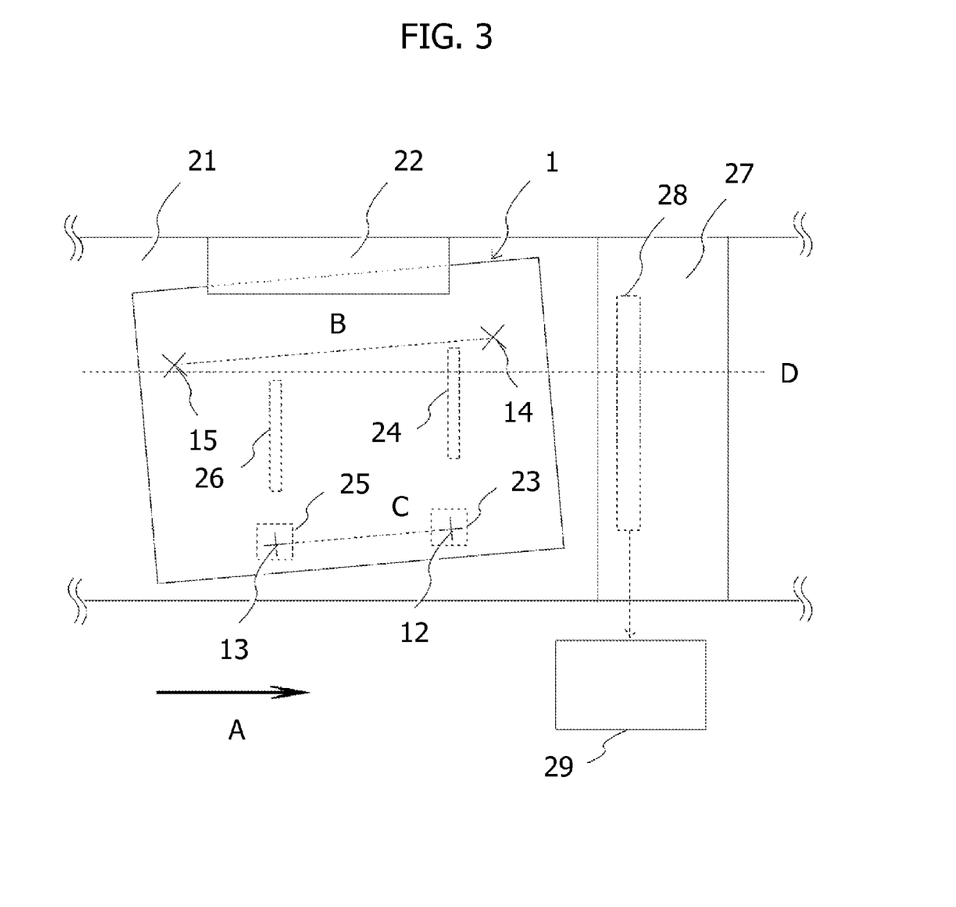
FIG. 3 is a schematic view illustrating a state in which the substrate to be exposed is aligned to the exposure apparatus of the present invention.
Figure 4:
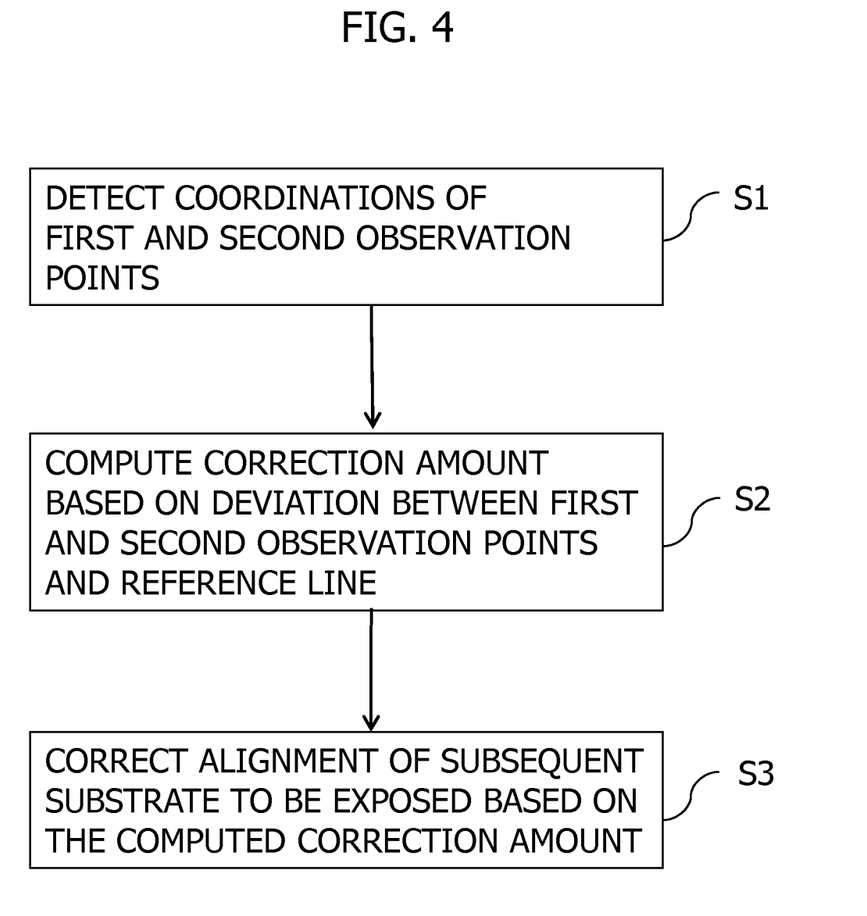
FIG. 4 is a flowchart illustrating an alignment correction method for the substrate to be exposed according to the present invention.

First, as illustrated in FIG. 3, the first alignment mark 12 and the second alignment mark 13 of a first substrate to be exposed 1 are detected by the first camera 23 and the second camera 25, respectively, and the substrate to be exposed 1 is moved by the first axis 24 and the second axis 26 so that the first alignment mark 12 and the second alignment mark 13 come to the centers of the first camera 23 and the second camera 25, respectively, to thereby align the substrate to be exposed 1. In this case, for example, if the positions of the first camera 23 and the second camera 25 are shifted in the scanning direction A as illustrated in FIG. 3 due to, for example, deformation of the exposure apparatus caused by heat, the position of the substrate to be exposed 1 becomes a shifted position according to the position of the shifted camera.

Figure 5:
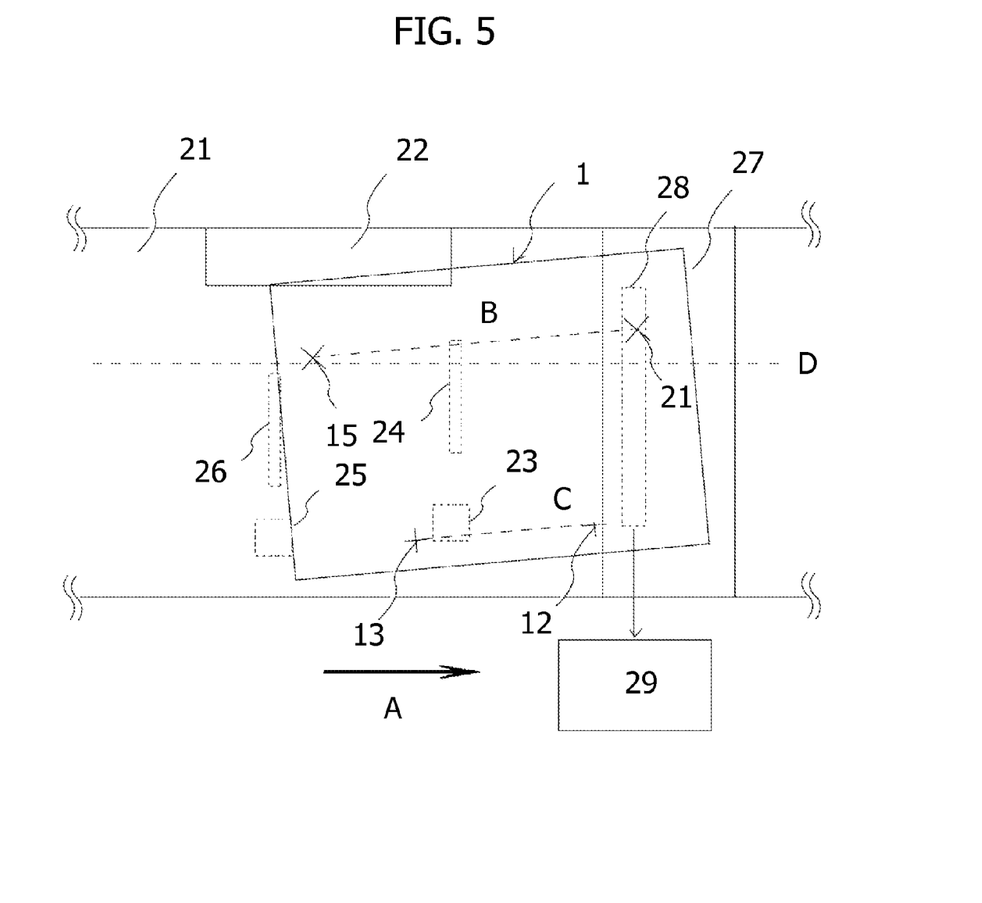
FIG. 5 is a schematic view illustrating a substrate to be exposed at a time of detecting a first observation point set in advance on the substrate to be exposed, in a coordinate detection step according to a first embodiment of the present invention.
Figure 6:
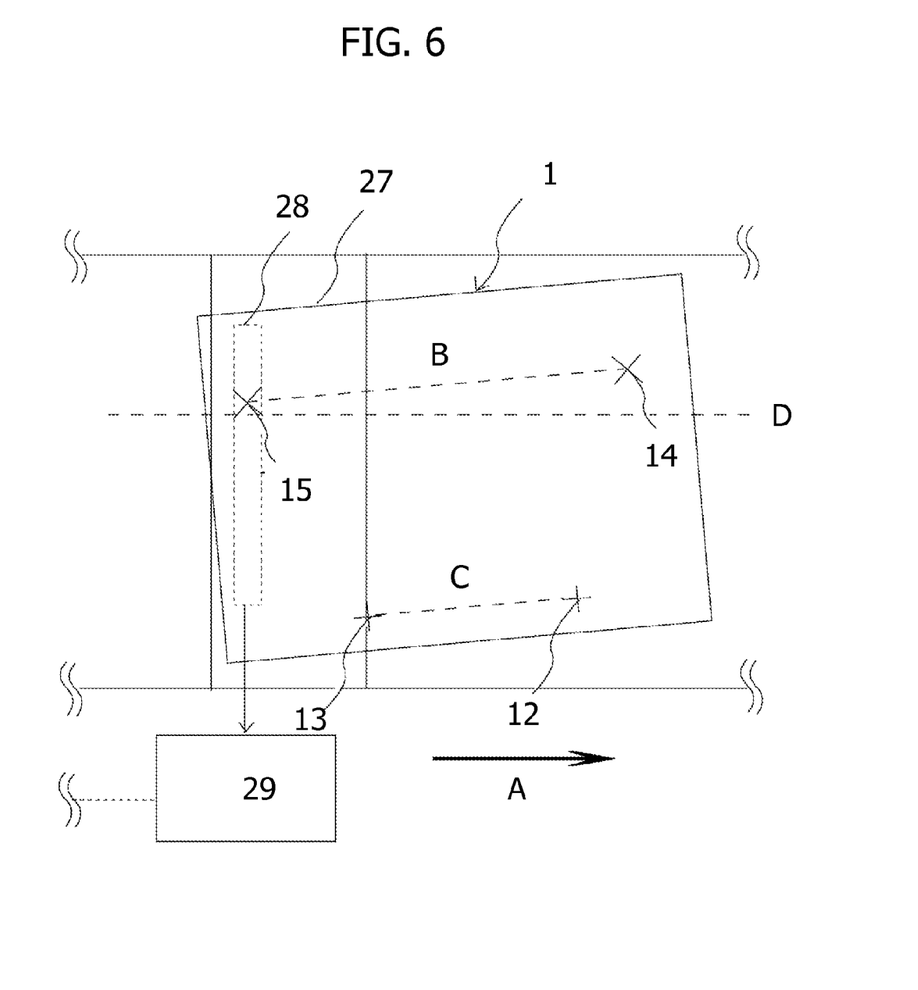
FIG. 6 is a schematic view illustrating a substrate to be exposed at a time of detecting a second observation point set in advance on the substrate to be exposed, in the coordinate detection step.

When the alignment of the substrate to be exposed 1 is completed, the substrate to be exposed 1 is scanned in the scanning direction A by the scanning device 22. In order to observe alignment deviation of the scanned substrate to be exposed 1, coordinates of the first observation point 14 and the second observation point 15 set in advance on the substrate to be exposed 1 are detected (step S1 in FIG. 4). At this time, first, as illustrated in FIG. 5, the substrate to be exposed 1 is scanned, and when the first observation point 14 formed on a surface of the substrate to be exposed 1 passes under the line image sensor 28, a coordinate of the first observation point 14 in the direction perpendicular to the scanning direction A in a plane parallel to the plane of the stage 21 is detected by the line image sensor 28, and the detected coordinate of the first observation point 14 is input into the correction amount computing device 29. Next, as illustrated in FIG. 6, when the substrate to be exposed 1 is further scanned and the second observation point 15 formed on the surface of the substrate to be exposed 1 passes under the line image sensor 28, a coordinate of the second observation point 15 in the direction perpendicular to the scanning direction A in a plane parallel to the plane of the stage 21 is detected by the line image sensor 28, and the detected coordinate of the second observation point 15 is input into the correction amount computing means 29.

Since the substrate to be exposed 1 is scanned at a constant speed, based on a time from observation of the first observation point 14 to observation of the second observation point 15, it is possible to determine coordinates of the first observation point 14 and the second observation point 15 in the scanning direction A. Furthermore, since a positional relationship among the first and second observation points 14, 15, and the first and second alignment marks 12, 13 is set in advance, it is possible to compute coordinates of the first and second alignment marks 12, 13 from the first and second observation points 14, 15. Here, these coordinates of the first and second alignment marks 12, 13 may be detected by the line image sensor 28.

When the coordinates of the first observation point 14 and the second observation point 15 are input, the correction amount computing device 29 compares a coordinate of a reference line D parallel to the scanning direction A, that is set in advance according to the positions of the first and second observation points 14, 15 and stored in the correction amount computing device 29, with coordinates of the first and second observation points 14, 15, and then, the correction amount computing device 29 computes a correction amount of the substrate to be exposed 1 based on a deviation between the first and second observation points 14, 15 and the reference line D (step S2). When the substrate to be exposed 1 arrives in a state in which it is accurately aligned, in FIGS. 1, 5 and 6, the reference line D is a line connecting coordinates of the first observation point 14 and the second observation point 15 detected by the line image sensor 28, and parallel to the scanning direction A. Thus, the reference line D is set in advance according to the set positions of the first observation point 14 and the second observation point 15.

Figure 7:
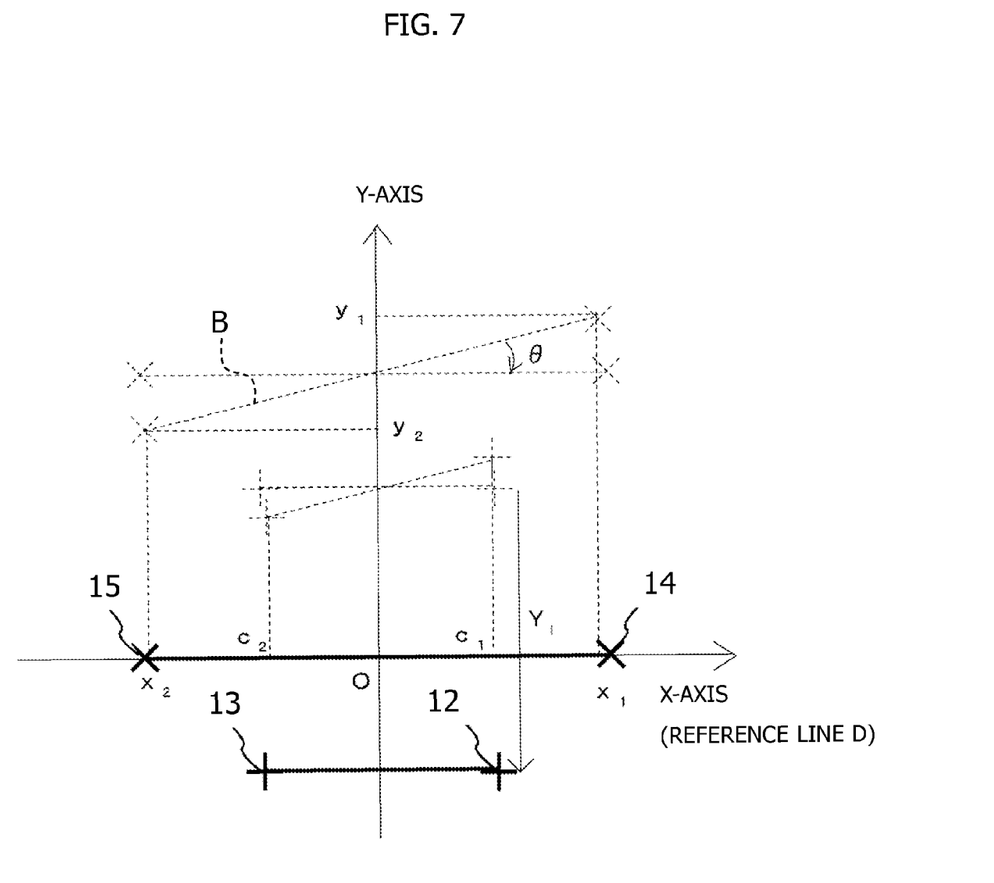
FIG. 7 is a view illustrating a process of computing a correction amount in the correction amount computing step of the first embodiment.

FIG. 7 shows a XY-plane (refer to FIG. 7) that is parallel to a plane of the stage 21 on which X-axis is the reference line D and Y-axis is a line perpendicular to the scanning direction A and passing through the center between the first alignment mark 12 and the second alignment mark 13. On the XY-plane, the first and second observation points 14, 15, and the first and second alignment marks 12, 13 are plotted. Here, the coordinate of the first observation point 14 is $(x_1, y_1)$, the coordinate of the second observation point 15 is $(x_2, y_2)$, the coordinate of the first alignment mark 12 is $c_1$ and the coordinate of the second observation point is $c_2$ $(=-c_1)$. In the following, the value of the correction amount includes a sign. With respect to an angle, a counter clockwise direction from the X-axis is designated as a positive direction.

In FIG. 7, in order to move a line B connecting the first and second observation points 14, 15 so as to agree with the X-axis (reference line B), as correction amounts for correcting the coordinates of the first alignment mark 12 and the second alignment mark 13, an offset amount $Y_1$ being a correction amount in the Y-axis direction and a gain amount $\theta$ being a rotation angle from the X-axis are computed. The offset amount $Y_1$ and the gain amount $\theta$ can be obtained by the following formulae.

$$Y_1 = \{(y_1-y_2)/(x_1-x_2)\}x_1 - y_1$$

$$\theta = -\tan^{-1}(y_1-y_2)/(x_1-x_2)$$

Figure 8:
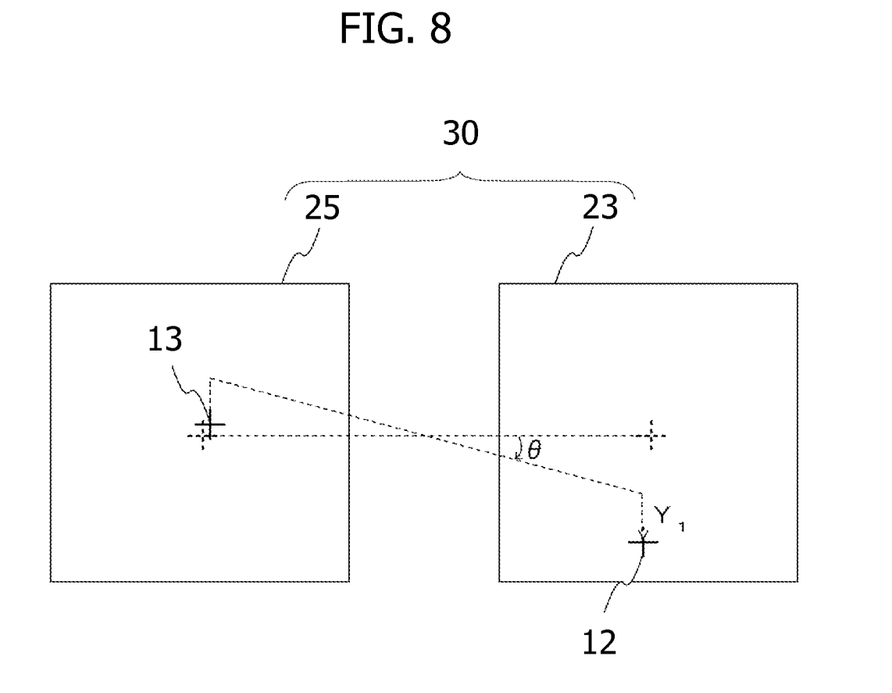
FIG. 8 is a schematic view illustrating positions of first and second cameras detecting the first and second alignment marks, respectively, in the alignment correction step of the first embodiment.

Based on the computed correction amounts, alignment of each of second and subsequent substrates to be exposed 1 is corrected (step S3). The computed correction amounts are input into the alignment correction device 30 from the correction amount computing device 29. In the first embodiment, the first camera 23 and the second camera 25 are employed as the alignment correction device. As illustrated in FIG. 8, at a time of aligning each of second and subsequent substrates to be exposed 1, first, in the same manner as the first substrate to be exposed 1, the substrate to be exposed 1 is aligned so that the first alignment mark 12 and the second alignment mark 13 come to the centers of the first camera 23 and the second camera 25, respectively, and thereafter, the substrate to be exposed 1 is rotated by the above gain amount $\theta$ so that the first alignment mark 12 and the second alignment mark 13 are symmetrical about the center of these marks, and furthermore, the first alignment mark 12 and the second alignment mark 13 are moved by the offset amount $Y_1$ in the Y-axis direction. Accordingly, a deviation that has occurred in the alignment of the first substrate to be exposed 1 is corrected, and alignment of subsequent substrate to be exposed 1 is properly performed. Therefore, even in a case in which the alignment accuracy at the time of alignment of the first substrate to be exposed 1 is deteriorated, it is possible to avoid a situation that correction of the alignment cannot catch up, and to enhance alignment accuracy. Furthermore, since alignment is corrected by moving the positions of the first alignment mark 12 and the second alignment mark 13 detected by the first camera 23 and the second camera 25, it is possible to correct alignment of the substrate to be exposed 1 regardless of movable ranges of the first camera 23 and the second camera 25 or the construction of alignment device such as the first axis 24 and the second axis 26.

Here, when the line B is tilted with respect to the X-axis, if the tilt is corrected, the X coordinates of the first observation point 14, the second observation point 15, the first alignment mark 12 and the second alignment mark 13 may be shifted from those coordinates detected by the line image sensor 28. However, since deviation of alignment is very small from the beginning, the above change amount is also a very small and negligible amount as compared with the computed correction amount. For this reason, the change amount is ignored also in the above computing formulae. This applies also to second and the third embodiments.

Figure 9:
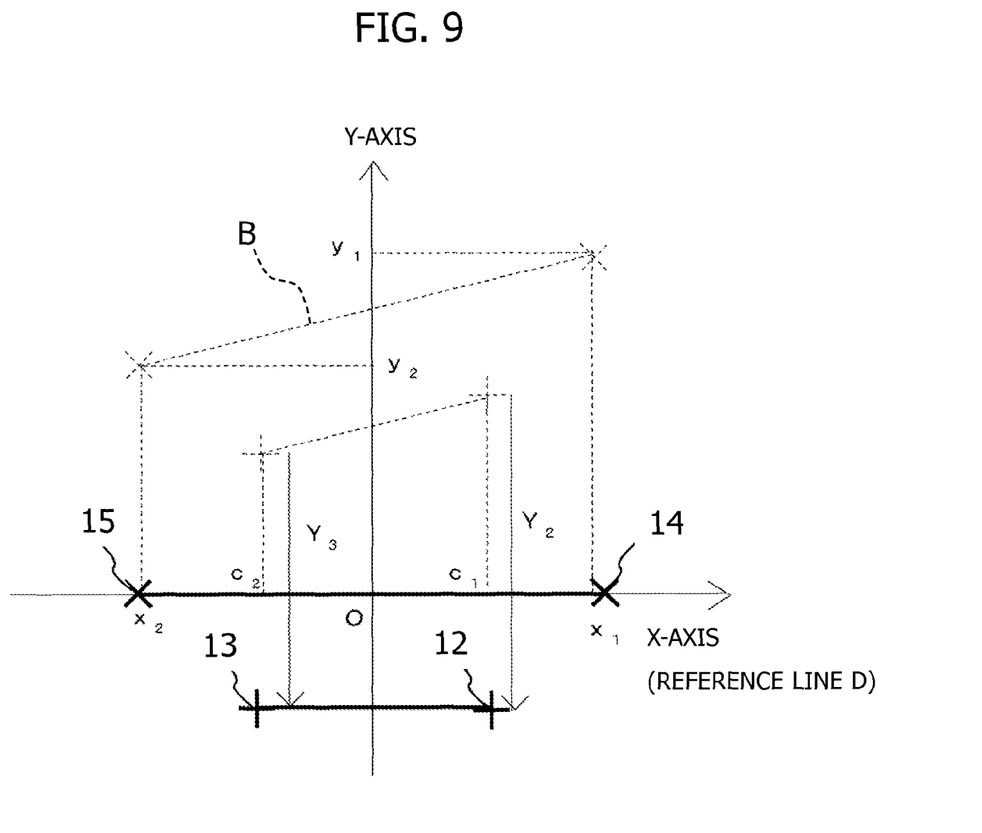
FIG. 9 is a view illustrating a process of computing a correction amount in the correction amount computing step of the second embodiment of the present invention.
Figure 10:
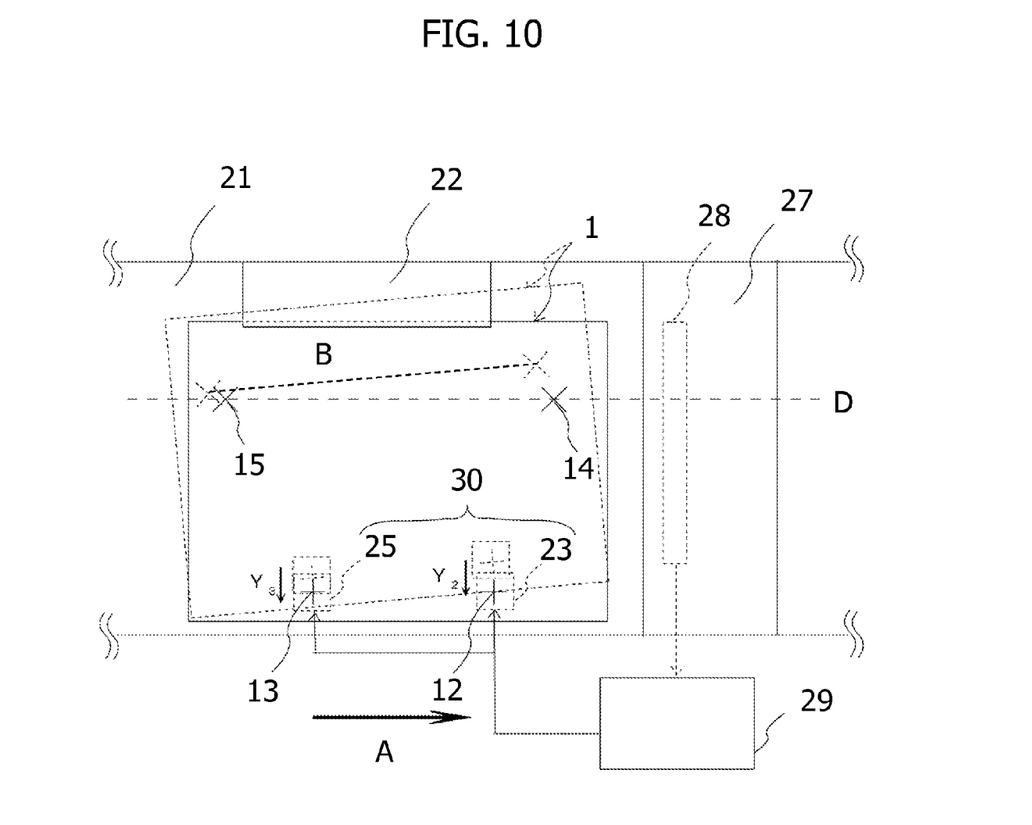
FIG. 10 is a schematic view illustrating movements of a first camera and a second camera in the alignment correction step of the second embodiment of the present invention.

Furthermore, a second embodiment of the alignment correction method using the substrate to be exposed 1 and the exposure apparatus having the above construction will be explained with reference to FIGS. 9 and 10.

In the second embodiment, detection of coordinates of the first observation point 14 and the second observation point 15 (step S1) is performed in the same manner as that of the first embodiment. In the second embodiment, the first camera 23 and the second camera 25 are employed as the alignment correction device 30. After step Si is performed, as illustrated in FIG. 9, based on deviations between coordinates of the first and second observation points 14, 15 and the reference line D (X-axis), the correction amount computing device 29 computes a first camera correction amount $Y_2$ being a correction amount of the first camera 23 and a second camera correction amount $Y_3$ being a correction amount of the second camera 25 in the Y-axis direction (step S2). The first camera correction amount $Y_2$ and the second camera correction amount $Y_3$ may be obtained by the following formulae.

$$Y_2 = \{(y_1-y_2)/(x_1-x_2)\}(x_1-c_1) - y_1$$

$$Y_3 = \{(y_1-y_2)/(x_1-x_2)\}(x_1-c_2) - y_1$$

Based on the computed correction amounts, alignment of each of second and subsequent substrates to be exposed 1 is corrected (step S3). As illustrated in FIG. 10, at a time of aligning each of second and subsequent substrates to be exposed 1, based on correction amounts input from the correction amount computing device 29, the first camera 23 is moved in the Y-axis direction by the first camera correction amount $Y_2$ and the second camera 25 is moved by the second camera correction amount $Y_3$, and thereafter, the first alignment mark 12 and the second alignment mark 13 are detected by the respective cameras. Accordingly, a deviation occurred in the alignment of the first substrate to be exposed 1 as illustrated by broken lines in FIG. 10 is corrected, and alignment of a subsequent substrate to be exposed 1 is performed properly as illustrated by the solid lines. Since the first and second cameras 23 and 25 are moved to correct alignment, even in a case in which the alignment accuracy at the time of alignment of the first substrate to be exposed 1 is markedly deteriorated, it is possible to correct alignment of the subsequent substrate to be exposed 1 so long as the deviation is within the movable ranges of the first camera 23 and the second camera 25.

Figure 11:
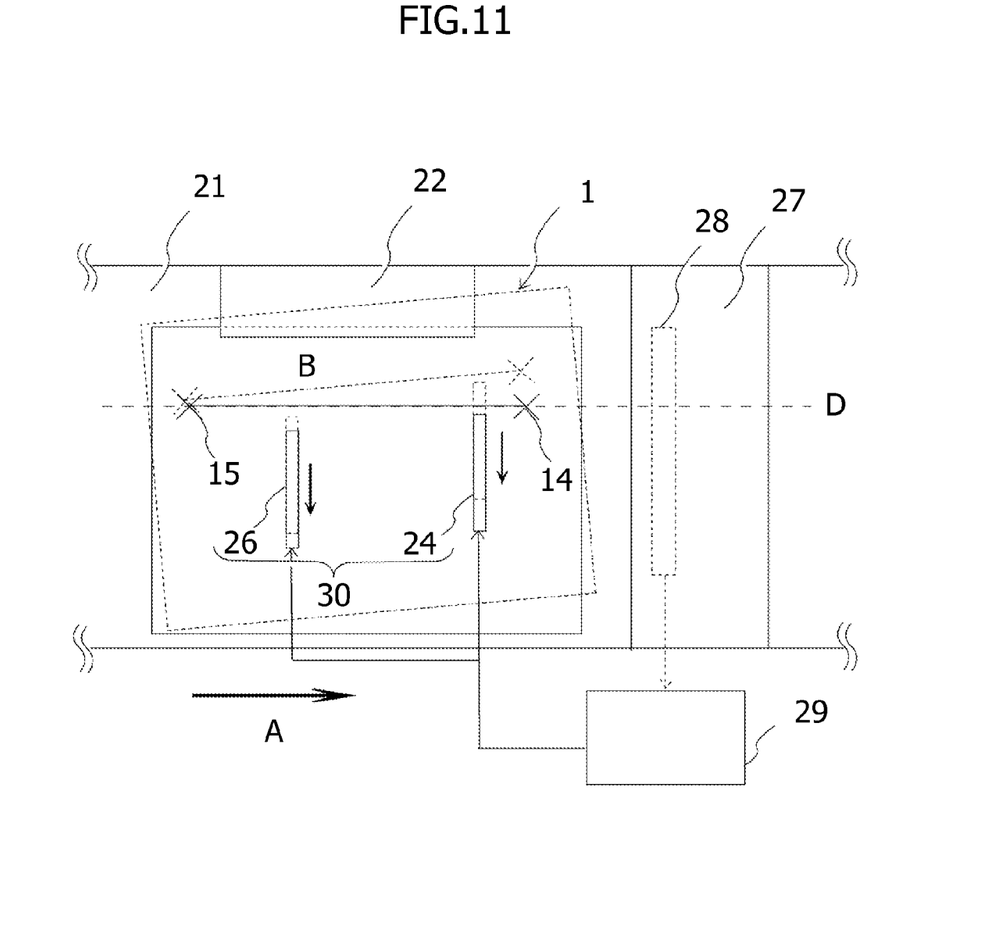
FIG. 11 is a schematic view illustrating movements of a first axis and a second axis in the alignment correction step of the third embodiment of the present invention.

Furthermore, a third embodiment of the alignment correction method using the substrate to be exposed 1 and the exposure apparatus having the above construction will be explained with reference to FIG. 11.

In the third embodiment, detection of coordinates of the first observation point 14 and the second observation point 15 (step S1) is performed in the same manner as those of the first and second embodiments. In the third embodiment, the first axis 24 and the second axis 26 are employed as the alignment correction device 30. Based on deviations between coordinates of the first and second observation points 14, 15 and the reference line D, the correction amount computing device 29 computes a first axis correction amount $Y_4$ being a correction amount of the first axis 24 in the Y-axis direction and a second axis correction amount $Y_5$ being a correction amount of the second axis 26 (step S2). Computing formulae of these correction amounts are the same as the computing formulae of the first camera correction amount and the second camera correction amount in the second embodiment when the X coordinates of the first axis 24 and the second axis 26 are the same as X coordinates of the first camera 23 and the second camera 25, respectively. That is, the first axis correction amount $Y_4$ and the second axis correction amount $Y_5$ can be obtained from the following formulae.

$$Y_4 = \{(y_1-y_2)/(x_1-x_2)\}(x_1-c_1)-y_1$$

$$Y_5 = \{(y_1-y_2)/(x_1-x_2)\}(x_1-c_2)-y_1$$

Based on the computed correction amounts, alignment of each of second and subsequent substrates to be exposed 1 is corrected (step S3). After the first alignment mark 12 and the second alignment mark 13 are detected by the first camera 23 and the second camera 25, respectively, and the substrate to be exposed 1 is aligned, based on the correction amounts input into the correction amount computing device 29, the first axis 24 is moved by the first axis correction amount $Y_4$ and the second axis 26 is moved by the second axis correction amount $Y_5$ in the Y-axis direction as illustrated in FIG. 11, to thereby correct the alignment of the substrate to be exposed 1. By this method, a deviation occurred in the alignment of the first substrate to be exposed 1 as illustrated by broken lines in FIG. 11 is corrected, and alignment of a subsequent substrate to be exposed 1 is properly performed as illustrated by the solid lines. Thus, the second and subsequent substrates are each aligned by the first camera 23 and the second camera 25, and the alignment is corrected by the first axis 24 and the second axis 26. Accordingly, even in a case in which the first camera 23 and the second camera 25 are fixed and not movable, it is possible to correct the alignment of the substrates 1 to be exposed.

Furthermore, in the alignment correction method for the present invention, the correction amount computing step (step S2) may include storing in a storing device of the exposure apparatus the computed correction amount for each of substrates to be exposed 1 having different shapes, and the alignment correction step (step S3) may include correcting alignment of the substrate to be exposed 1 by using the stored correction amounts for each of substrates to be exposed 1 having different shapes. By such a configuration, based on correction amounts stored for each of substrates to be exposed having different shapes, it is possible to correct alignment of subsequent substrates to be exposed 1 having the same shape. Accordingly, with respect to substrates to be exposed 1 having the same shape as that for which a correction amount is computed and stored, it is possible to perform exposure in a corrected alignment state from the first substrate to be exposed 1.

Here, in the above first to third embodiments, a first substrate to be exposed 1 is scanned in a state in which it is tilted with respect to the scanning direction A. Accordingly, exposure of the first substrate to be exposed 1 is preferably performed in such a manner that the positions of edge portions of pixels 11 along the line B are detected by the line image sensor 28, and the exposure device 27 is moved in a direction perpendicular to the scanning direction A in a plane parallel to the plane of the stage 21 so that a deviation amount between the detected positions of the edges and a reference position set in advance in the line image sensor 28 becomes a predetermined value, to thereby perform exposure while the exposure device 27 follows the substrate to be exposed 1. As an alternative, the first substrate to be exposed 1 may be used as a dummy substrate.

It should be noted that the entire contents of Japanese Patent Application No. 2011-170292, filed on Aug. 3, 2011, on which convention priority is claimed, is incorporated herein by reference.

It should also be understood that many modifications and variations of the described embodiments of the invention will be apparent to a person having an ordinary skill in the art without departing from the spirit and scope of the present invention as claimed in the appended claims.

What is claimed is:

1. An alignment correction method for a substrate to be exposed, which corrects alignment of a subsequent substrate to be exposed based on an alignment deviation of a previously exposed substrate to be exposed, in a process of exposing successively substrates to be exposed that are being scanned in a scanning direction by a scanning device,
the method comprising the steps of:
detecting coordinates of a first observation point and a second observation point set in advance on a substrate to be exposed that is being scanned in the scanning direction, so as to observe an alignment deviation of the substrate to be exposed;
computing a correction amount based on a deviation between the detected coordinates and a reference line set in advance according to the first observation point and the second observation point; and
correcting alignment of a subsequent substrate to be exposed based on the computed correction amount.

2. The alignment correction method for a substrate to be exposed according to claim 1,
wherein the alignment of the substrates to be exposed is performed based on information of a first alignment mark and a second alignment mark formed on a surface of the substrate to be exposed, that are detected by a first camera provided on an upstream side of the scanning direction and a second camera provided on a downstream side in the scanning direction, wherein the correction amount computing step includes computing offset amounts and a gain amount, the offset amounts being correction amounts of the first alignment mark provided on the upstream side of the scanning direction of the substrate to be exposed and a second alignment mark provided on the downstream side in the scanning direction, in a direction intersecting the scanning direction in a plane parallel to a scanning plane, and the gain amount being a correction amount of tilt of the substrate to be exposed with respect to the reference line, and wherein the alignment correction step includes, after detecting the first alignment mark and the second alignment mark by the first camera and the second camera and aligning the substrate to be exposed, rotating the substrate to be exposed by the gain amount so that the first and second alignment marks are symmetrical about the center of these marks, and moving these marks by the offset amount in a direction intersecting the scanning direction, to thereby correct the alignment of the substrate to be exposed.

3. The alignment correction method for a substrate to be exposed according to claim 1, wherein the alignment of the substrates to be exposed is performed based on information of a first alignment mark and a second alignment mark formed on a surface of the substrate to be exposed, that are detected by a first camera provided on the upstream side of the scanning direction and a second camera provided on the downstream side in the scanning direction, wherein the correction amount computing step includes computing a first camera correction amount and a second camera correction amount based on a deviation between the coordinates of the first and second observation points and the reference line, the first camera correction amount being a correction amount of the first camera, and the second camera correction amount being a correction amount of the second camera, in a direction intersecting the scanning direction in a plane parallel to the scanning plane, and wherein the alignment correction step includes moving the first camera by a first camera correction amount, and moving the second camera by a second camera correction amount, in a direction intersecting the scanning direction, to thereby correct the alignment of the substrate to be exposed.

4. The alignment correction method for a substrate to be exposed according to claim 1, wherein the alignment of the substrates to be exposed is performed based on information of a first alignment mark and a second alignment mark formed on a surface of the substrate to be exposed, that are detected by a first camera provided on the upstream side of the scanning direction and a second camera provided on the downstream side in the scanning direction, wherein the correction amount computing step includes computing a first axis correction amount and a second correction amount based on a deviation between the coordinates of the first and second observation points and the reference line, the first axis correction amount being a correction amount of a first axis, and the second correction amount being a correction amount of a second axis, in a direction intersecting the scanning direction in a plane parallel to the scanning plane, and wherein the alignment correction step includes, after detecting the first alignment mark and the second alignment mark by the first camera and the second camera and aligning the substrate to be exposed, moving the first axis by the first axis correction amount and moving the second axis by the second axis correction amount, in a direction intersecting the scanning direction, to thereby correct the alignment of the substrate to be exposed.

5. The alignment correction method for a substrate to be exposed according to claim 1, wherein the correction amount computing step includes storing the computed correction amount for each of substrates to be exposed having different shapes, and wherein the alignment correction step includes correcting alignment of the substrate to be exposed by using the stored correction amounts for the substrates to be exposed having different shapes.

6. An exposure apparatus, which corrects an alignment deviation of a subsequent substrate to be exposed based on an alignment deviation of a previously exposed substrate to be exposed, and exposes successively substrates to be exposed that are being scanned in a scanning direction by a scanning device, the apparatus comprising:

a coordinate detection device that detects coordinates of a first observation point and a second observation point set in advance on a substrate to be exposed that is being scanned in the scanning direction, so as to observe an alignment deviation of the substrate to be exposed;

a correction amount computing device that computes a correction amount based on a deviation between the detected coordinates and a reference line set in advance according to the first observation point and the second observation point; and an alignment correction device that corrects alignment of a subsequent substrate to be exposed based on the computed correction amount.

* * * * *